United States Patent
Korden

(10) Patent No.: US 7,944,325 B2
(45) Date of Patent: May 17, 2011

(54) ELECTRICAL MODULE WITH SPECIFIED GROUND-SIDE CONNECTION OF FILTER CIRCUIT SHUNT ARMS

(75) Inventor: Christian Korden, Munich (DE)

(73) Assignee: EPCOS AG, Munich (DE)

( * ) Notice: Subject to any disclaimer, the term of this patent is extended or adjusted under 35 U.S.C. 154(b) by 46 days.

(21) Appl. No.: 12/352,730

(22) Filed: Jan. 13, 2009

(65) Prior Publication Data

US 2009/0174497 A1 Jul. 9, 2009

Related U.S. Application Data

(63) Continuation of application No. PCT/DE2007/001294, filed on Jul. 19, 2007.

(30) Foreign Application Priority Data

Jul. 20, 2006 (DE) .................. 10 2006 033 709

(51) Int. Cl.
*H03H 7/46* (2006.01)
*H03H 9/52* (2006.01)
*H03H 9/70* (2006.01)

(52) U.S. Cl. ......... 333/132; 333/133; 333/193; 333/189

(58) Field of Classification Search .................. 333/133, 333/193, 195, 187, 189, 100, 129, 132, 134

See application file for complete search history.

(56) References Cited

U.S. PATENT DOCUMENTS

| | | | |
|---|---|---|---|
| 6,107,899 A * | 8/2000 | Taguchi et al. | 333/193 |
| 6,323,744 B1 | 11/2001 | Barber et al. | |
| 6,404,303 B1 * | 6/2002 | Kuroda | 333/193 |
| 6,756,864 B2 * | 6/2004 | Muramatsu | 333/133 |
| 6,788,168 B2 * | 9/2004 | Guitton et al. | 333/170 |
| 7,053,731 B2 | 5/2006 | Iwamoto et al. | |
| 7,289,008 B2 * | 10/2007 | Kuroki et al. | 333/133 |
| 7,332,986 B2 * | 2/2008 | Koga et al. | 333/193 |
| 7,339,445 B2 * | 3/2008 | Aigner et al. | 333/133 |
| 7,449,977 B2 | 11/2008 | Schoening et al. | |
| 7,479,847 B2 * | 1/2009 | Yamakawa et al. | 333/133 |
| 2004/0104790 A1 | 6/2004 | Nishihara et al. | |
| 2004/0227585 A1 | 11/2004 | Taniguchi et al. | |
| 2005/0104685 A1 | 5/2005 | Kuroki et al. | |

FOREIGN PATENT DOCUMENTS

DE 10 2004 040 967 A1 3/2006
JP 2002-124847 * 4/2002

* cited by examiner

*Primary Examiner* — Barbara Summons
(74) *Attorney, Agent, or Firm* — Slater & Matsil, L.L.P.

(57) ABSTRACT

An electrical module with a first substrate, and a component mounted on the first substrate is specified. The component includes a second substrate and a chip arranged on the second substrate. In the module, a filter circuit is realized that includes shunt arms connected to ground each with at least one parallel resonator. The parallel resonators are arranged on the chip. The ground-side connection of at least two of the shunt arms to each other is realized outside the chip and the second substrate. The ground-side connection of the shunt arms is advantageously realized in the first substrate or on a circuit board on which the first substrate is arranged.

19 Claims, 5 Drawing Sheets

ELECTRICAL MODULE WITH SPECIFIED GROUND-SIDE CONNECTION OF FILTER CIRCUIT SHUNT ARMS

This application is a continuation of co-pending International Application No. PCT/DE2007/001294, filed Jul. 19, 2007, which designated the United States and was not published in English, and which claims priority to German Application No. 10 2006 033 709.3 filed Jul. 20, 2006, both of which applications are incorporated herein by reference.

BACKGROUND

U.S. Pat. No. 7,053,731 B2 discloses a duplexer with a substrate and a chip arranged on this substrate. This device comprises a transmission filter and a reception filter. Each filter comprises a ladder-type arrangement of electroacoustic resonators.

SUMMARY

In one aspect, the present invention reduces, in an electrical module with a filter circuit, the influence of additional module components on the zero points in the transmission function of the filter circuit.

In one embodiment, an electrical module with a first substrate and a component mounted on the first substrate is specified. The component comprises a second substrate and a chip arranged on the second substrate. In the module, a filter circuit is realized that comprises shunt arms connected to ground each with at least one parallel resonator. The parallel resonators are arranged on the chip. The ground-side connection of at least two of the shunt arms to each other takes place outside the chip and the second substrate.

The ground-side connection of the shunt arms is advantageously realized in the first substrate or on a circuit board on which the first substrate is mounted.

Within the second substrate, advantageously no ground-side connection of the shunt arms takes place. However, it is also possible for a few of the shunt arms to be connected to each other on the ground side within the second substrate or on the chip, wherein, however, for at least two of the shunt arms, it applies that they are first connected to each other on the ground side underneath the second substrate. The shunt arms connected to each other on the ground side within the second substrate advantageously belong to one and the same filter, e.g., the transmission filter or the reception filter of a duplexer. The ground-side connection that takes place within the second substrate is also designated as an intermediate ground. It is realized advantageously in one of the lower metallization planes or on the bottom side of the second substrate. The intermediate ground and at least one other shunt arm of one and the same filter circuit are then connected to a common ground surface (overall ground) that lies in the first substrate or underneath the first substrate, e.g., on the circuit board.

Ground-side connections are advantageously performed by means of a conductive surface, i.e., an overall ground is advantageously realized as a large-area ground surface. An intermediate ground can also be realized as a conductive surface, and also as an elongated strip conductor.

The reference ground of the filter circuit advantageously matches the reference ground of the module, because within the component, the connection of the shunt arms to a local reference ground was eliminated. Through a direct connection of shunt arms of the filter circuit to a global ground, i.e., the module ground, it is possible to prevent a difference in potential between a local ground and the global ground. This measure is also an advantage for other, advantageously for all functional units contained in the module.

With the specified ground connection of the filter circuit that is advantageously produced by means of as many via contacts as possible, it is possible to reduce parasitic inductance contained in the shunt arms to the module reference ground.

The electrical module is advantageously constructed as an electrical component that has external connections arranged on the bottom side of the first substrate.

The filter circuit comprises, in addition to the shunt arms, advantageously series arms each with at least one series resonator that is arranged on the chip.

The module advantageously comprises at least one transmit-reception path that has a transmit path and a reception path. The transmit path and the reception path can be integrated by means of a frequency switch, e.g., a duplexer, to form a common antenna path.

The filter circuit advantageously comprises a duplexer that is used for separating transmission and reception signals. The duplexer comprises a transmission filter and a reception filter. Each filter has resonators that are wired to each other and that are arranged on the chip. The resonators comprise series resonators arranged in the series arms and parallel resonators arranged in the shunt arms. The series resonators and the parallel resonators together form a ladder-type arrangement.

The series and parallel resonators are advantageously arranged in an alternating configuration. The resonators advantageously comprise converters operating with surface acoustic waves and/or resonators operating with bulk acoustic waves.

The shunt arms connected to each other on the ground side outside the chip and the second substrate can be arbitrary shunt arms of the duplexer. In one advantageous variant, these shunt arms can belong to the transmission filter or to the reception filter. One of these shunt arms can also be a shunt arm that connects the antenna to ground. The shunt arm connected to this shunt arm outside the chip and the second substrate can belong to the transmission filter or the reception filter.

In another variant, of the shunt arms connected to each other on the ground side outside the chip and the second substrate, at least one arm can belong to a transmission filter and at least one other arm can belong to a reception filter of the duplexer. In particular, there is the possibility to connect all of the shunt arms of the transmission filter to a first intermediate ground and all of the shunt arms of the reception filter to a second intermediate ground, wherein the two are connected to an advantageously deeper overall ground.

At least one of the intermediate grounds can be arranged in the second substrate, advantageously in one of the lowest metallization planes or on the bottom side of the second substrate. However, the two can also be arranged in the first substrate or on the circuit board. The overall ground can be arranged in the first substrate, advantageously in one of the lowest metallization planes, or on the bottom side of the first substrate. However, it can also be arranged on the circuit board.

The duplexer represents a functional unit of the module, wherein the module advantageously has other functional units.

The electrical connection between each parallel resonator and a ground advantageously forms an inductor that forms a series oscillating circuit with the static capacitor of the parallel resonator. At the resonance frequency of this oscillating circuit, signals are transmitted to ground, by means of which a zero point is generated in the transmission function of the duplexer. The frequency position of this zero point can be shifted to lower frequencies by the influence of different functional units of the module. This effect depends especially on the type of ground connection of the shunt arms. Therefore, because the ground connection of the shunt arms is realized first in the module substrate, it is possible to reduce the influence of the functional units that are different from the duplexer to the frequency position of the zero points, which is considered advantageous. Therefore it is possible, in particular, to generate the zero points in the stop band of each signal path. The stop band can comprise the back band.

The electrical component mentioned above is a component of the duplexer, wherein a part of the duplexer, that is, its ground connection, is realized in the first substrate. The ground connection comprises a ground surface arranged in the first substrate and electrical connections between this ground surface and ground connections of the component that are advantageously arranged on the bottom side of the second substrate. The ground surface is advantageously a module ground that is a common ground for all of the functional units contained in the module.

Both the first and also the second substrate are advantageously a multiple-layer substrate that comprises several metallization planes and dielectric layers arranged between these metallization planes. The metallization planes are connected to each other in a conductive way by means of via contacts. The dielectric layers of each substrate advantageously contain ceramic, glass, or plastic. As plastic, e.g., epoxy resins reinforced with glass fiber or LCP (liquid crystal polymer) are suitable.

The module ground is advantageously arranged in one of the lowest metallization planes of the first substrate. The module ground can be arranged in an advantageous variant in the lowest plane of the first substrate in which external electrical connections of the module are arranged.

On the top side of the first substrate there is a metal layer that comprises contact surfaces for contacting the component. On the bottom side of the second substrate there is a metal layer that comprises connection surfaces for contacting the first substrate. The connection surfaces comprise ground connections and also signal connections, underneath an antenna connection, a connection of the transmission filter, and a connection of the reception filter. On the top side of the second substrate there is a metal layer that comprises contact surfaces for contacting the chip.

The via contacts represent vertical electrical connections arranged in the dielectric layers. The inherent inductance of the via contacts can be used as an inductor (coil) in the circuit of the component that comprises the duplexer.

The metal layers can comprise elongated strip conductors or planar conductive surfaces. The elongated strip conductors can comprise a folded strip conductor and/or a strip conductor that reproduces at least a part of a winding. In this way, a part of an inductor can be realized. An inductor can thus be realized partially by means of via contacts and partially by means of strip conductors.

The strip conductors and the conductive surfaces are suitable as horizontal electrical connections for connecting the functional units of the module. The conductive surfaces can be used for forming an intermediate ground. Conductive surfaces arranged one above the other can be used for forming a capacitor.

In the first and/or second substrate, an electrical circuit can be realized that is connected electrically to the duplexer or that forms a part of the duplexer. This circuit can comprise, for example, a matching circuit that comprises in an advantageous variant a shunt arm that is arranged between an antenna connection of the duplexer and ground. The matching circuit can be used for antenna-side matching of the impedance of the transmission filter and/or reception filter, wherein the matching circuit is arranged between an antenna and the duplexer. Alternatively, the transmission filter and/or the reception filter can be arranged between the matching circuit and the antenna.

The circuit realized in the first or second substrate can comprise a balanced-unbalanced transformer. This circuit can also comprise a filter circuit, in particular, a low-pass filter and/or a high-pass filter. In particular, it is possible to realize an antenna diplexer by means of the strip conductors and the conductive surfaces in one of the substrates.

In the module, an electrical circuit is realized that comprises, in addition to the duplexer, advantageously other functional units, underneath, e.g., another filter, another duplexer, a diplexer, a switch, an amplifier, etc.

The module comprises, in addition to the component that is mentioned above and that comprises the resonators of the duplexer, advantageously other components that are advantageously also constructed as chip components and are arranged on the first substrate. The other components can comprise, e.g., at least one chip that is selected from a filter chip, a semiconductor chip, a chip inductor, a chip capacitor, etc. A semiconductor chip can comprise a switch and/or an amplifier.

The first substrate comprises, in particular, wiring that connects in a conductive way the components to each other and to external connections of the first substrate. The circuit realized at least partially in the first substrate can have circuit elements constructed as strip conductors and/or conductive surfaces. This circuit can be arranged in the equivalent circuit diagram, e.g., between the functional units of the module or can comprise at least one of these functional units.

The component advantageously comprises a shielding surface. This can be constructed as a metal cover that closes the second substrate, wherein a hollow space for holding the chip is formed. The shielding surface, however, can also comprise a metal surface that is arranged on the reverse side of the chip. The ground connection of the shielding surface is advantageously realized not in the second substrate, but instead in the first substrate.

The shielding surface can be connected in a conductive way by means of an electrical connection arranged in the first substrate to one of the parallel resonators of the reception filter. The electrical connection is advantageously connected in a conductive way to a ground surface that is arranged in the first substrate and to which the shunt arms of the transmission filter and the reception filter are connected.

One of the parallel resonators of the reception filter can be connected in a conductive way in another variant by means of an electrical connection arranged on the chip or in the second substrate to the shielding surface, wherein the shielding surface is connected in a conductive way by means of an electrical connection to the ground surface that is arranged in the first substrate and to which the shunt arms of the transmission filter and the reception filter are connected.

It is advantageous if the electrical connections that lead to the ground surface arranged in the first substrate comprise at least one inductor that is arranged in the first substrate. They can each, however, comprise another inductor that is arranged in the second substrate.

At least one of the electrical connections arranged in the first and/or second substrate can comprise at least one strip conductor that has at least one partial winding or is folded. In this way, the inductance value of the inductor to be realized by the electrical connection can be increased.

BRIEF DESCRIPTION OF THE DRAWINGS

The specified module will now be explained with reference to schematic figures that are not true to scale. Shown are.

Figure 1:
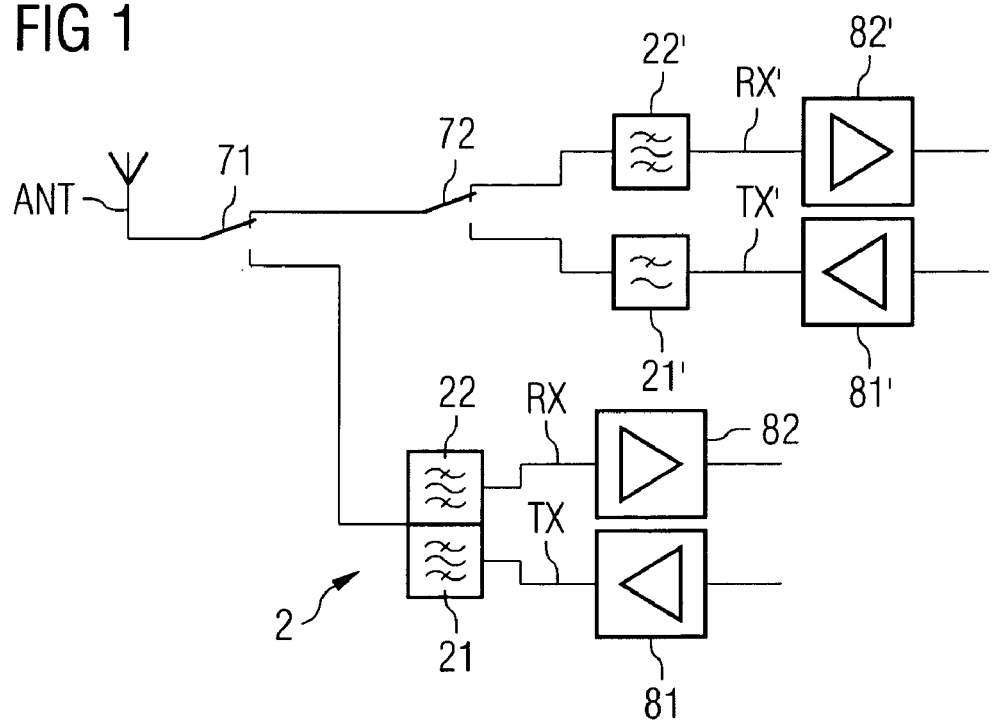
FIG. 1, shows the equivalent circuit diagram of an example module.

The following list of reference symbols can be used in conjunction with the drawings:

1, 1', 1" Component
11 Substrate
12 Chip
13 Shielding surface
2 Duplexer
20 Antenna connection of the component 1
21, 21' Transmission filter
22, 22' Reception filter
3 Carrier
31-36 Series resonator
41-44 Parallel resonator
51-54, 58, 59 Ground connection
56 Connection of the transmission filter
57 Connection of the reception filter
63 Conductive surface
64 Ground surface that lies at the reference potential of the module
69 Reference potential of module
71 Switch
72 Switch
81, 81' Power amplifier
82, 82' Low-noise amplifier
91, 92 External connections of the module
ANT Antenna
$L_{ANT}$, $L_{RX1}$, $L_{RX2}$, $L_{TX1}$, $L_{TX2}$, $L_p$, $L_o$ Inductors
RX, RX' Reception path
TX, TX' Transmission path

DETAILED DESCRIPTION

Figure 2:
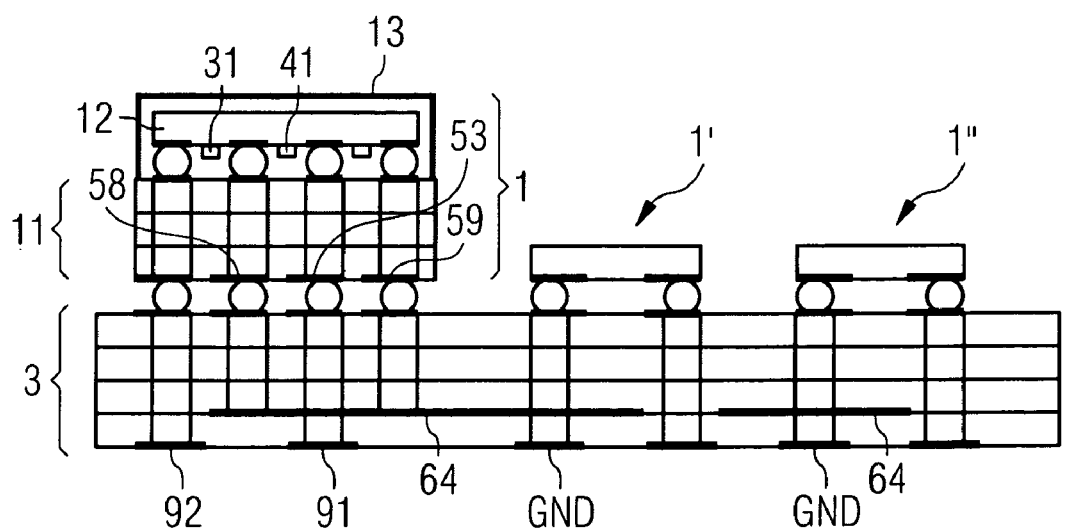
FIG. 2, shows in cross section, a module with a component in which there is no ground connection of the shunt arms.

In FIG. 1, the equivalent circuit diagram of an electrical module is shown that is shown in cross section in FIG. 2. The module presented in FIG. 1 comprises a module circuit that is suitable for transmitting data in two radio bands. The module circuit comprises a first signal path that is used for transmitting data in the first radio band.

The first signal path comprises a transmission path TX in which a transmission filter 21 is arranged and a reception path RX in which a reception filter 22 is arranged. The filters 21, 22 are bandpass filters that form a duplexer 2. The paths TX, RX are integrated into a common transmission-reception path on the antenna side by means of the duplexer 2.

The module circuit also comprises a second signal path that is used for transmitting data in the second radio band. The second signal path has a transmission path TX' and a reception path RX'. The paths TX', RX' are integrated into a common transmission-reception path on the antenna side by means of a switch 72. The first and the second signal path are connected in a conductive way to an antenna connection ANT by means of a switch 71.

In the transmission path TX, there is a power amplifier 81 and in the reception path RX, there is a low-noise amplifier 82. In the transmission path TX', there is a transmission filter 21' and a power amplifier 81'. In the reception path RX', there is a reception filter 22' and a low-noise amplifier 82'.

The module represents a compact, modular component that comprises a substrate 3 and chip components 1, 1', 1" that are mounted on the first substrate 3. The chip component 1 advantageously comprises at least one part of the duplexer 2. The switches 71, 72, the filters 21', 22', and the amplifiers 81, 82, 81', 82' are advantageously realized in chip components 1', 1". The chip component 1' comprises, e.g., at least one of the switches 71, 72 and the chip component 1" comprises at least one of the amplifiers. The chip components are advantageously constructed as SMD components. SMD stands for surface mounted device. The chip components can also be mounted on the substrate 3 by means of flip-chip or wire bonding technology.

The electrical connections between the functional units are realized at least partially in the first substrate 3. At least one of these functional units, in particular, the filter 21', or another functional unit not shown in FIG. 1 can also be integrated in the substrate 3.

The chip component 1 comprises a second substrate 11 on which a chip 12 is mounted.

The second substrate 11 and a cover that has a shielding surface 13 together form a housing (package) for the chip 12. The shielding surface 13 can be considered as a local ground of the component 1. Within the component, however, there is no (direct) connection of the shunt arms to the local ground of the component. The conductive connection between the shunt arms of the duplexer 2 and the local ground of the component 1 is realized first in the module substrate, i.e., in the first substrate 3.

On the chip 12 are series resonators 31-36 and parallel resonators 41-44. The resonators 31-36, 41-44 are connected electrically by means of electrical feedthroughs that are arranged partially in the second substrate 11 to other functional units and/or external connections 91, 92, GND of the module. The signal-guiding connection 92 shown in FIG. 2 can be connected to the connection 20 of the component or one of the signal paths TX, RX.

Figure 6:
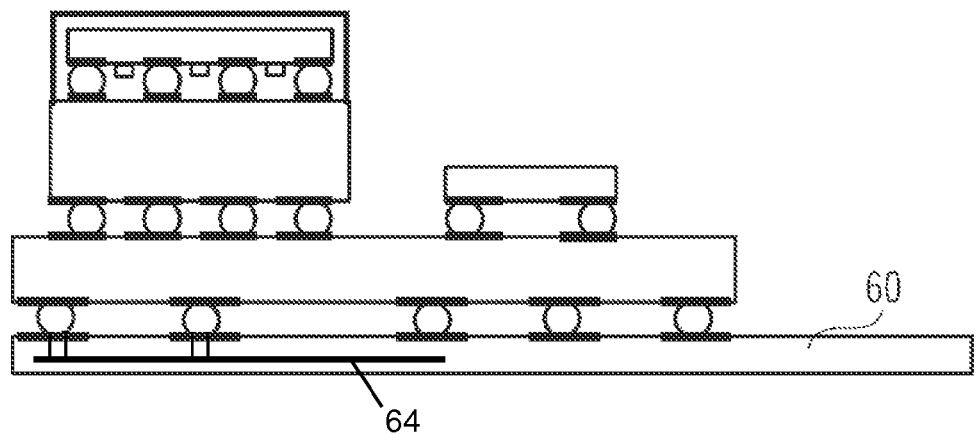
FIG. 6 shows, in cross section, a module with a component where a ground-side connection is realized on a circuit board on which a substrate is mounted.

Advantageously, ground connections of all of the functional units of the module are connected to a common ground surface 64 that lies at the reference potential 69 of the module and is arranged in the first substrate 3. The ground surface 64 is advantageously arranged in one of the lowest metallization planes of the first substrate 3. The ground surface 64 is connected in a conductive way to at least one external connection 91, GND of the module. As shown in FIG. 6, the external connection 91 can be coupled to a circuit board 60.

Figure 3A:
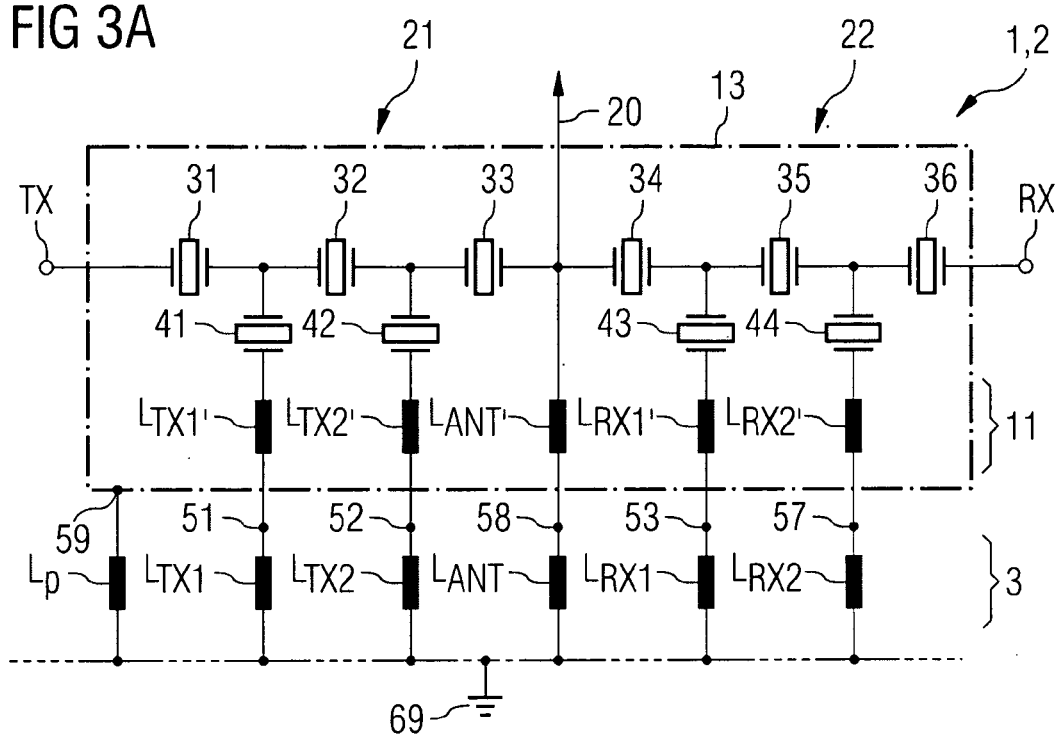
FIGS. 3A, 4A, 5A, each show the equivalent circuit diagram of a duplexer whose shunt arms are connected to each other in a conductive way outside the duplexer substrate.
Figure 4A:
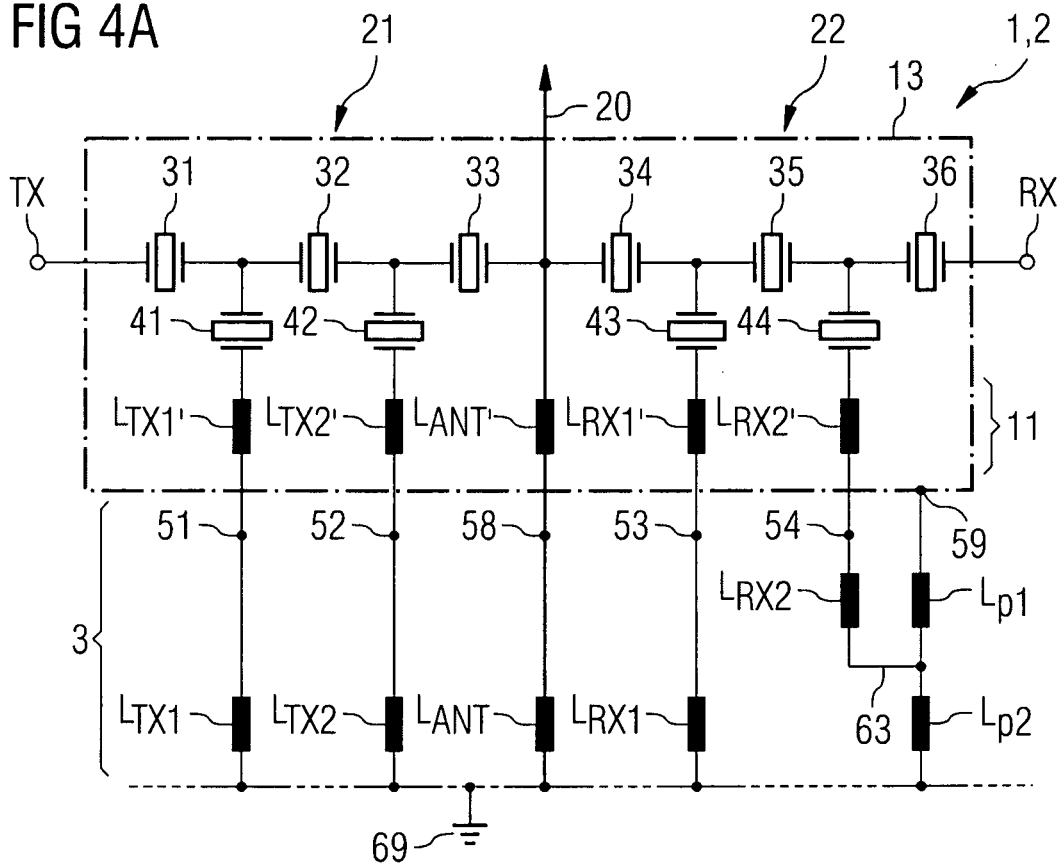
Figure 5A:
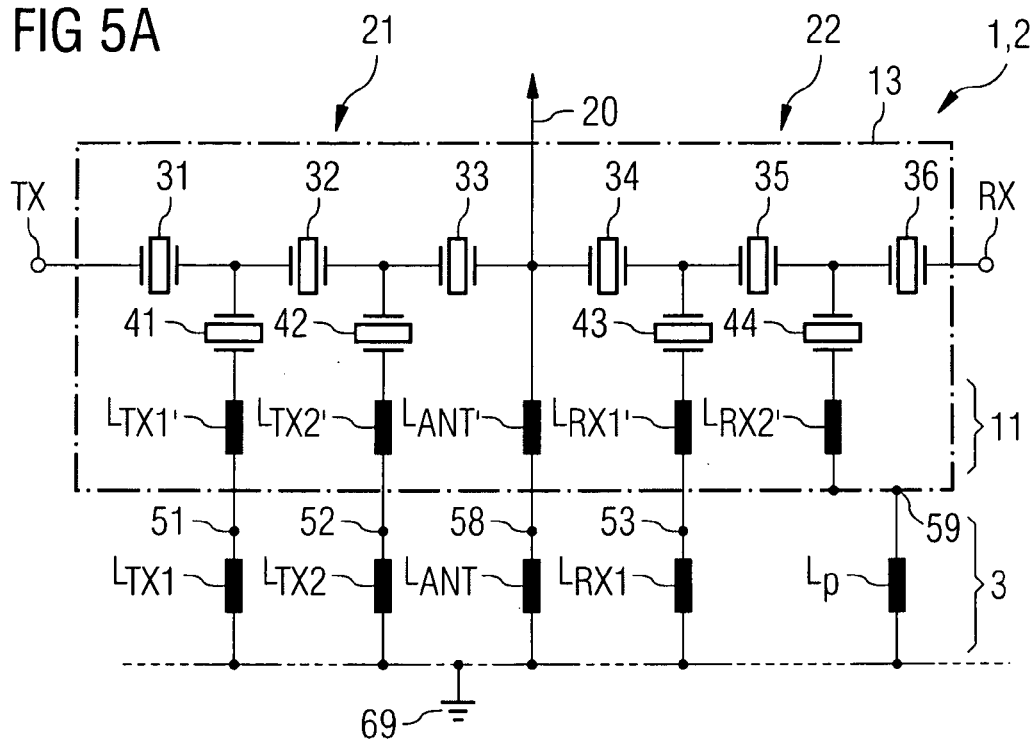

Equivalent circuit diagrams of a duplexer 2 whose shunt arms comprise sections arranged in the first substrate 3 are shown in FIGS. 3A, 4A, 5A.

Each filter 21, 22 comprises a ladder-type arrangement of resonators that comprises series arms with series resonators 31-33, 34-36 arranged therein and shunt arms connected to ground with parallel resonators 41, 42, 43, 44 arranged therein. Resonators working with acoustic waves, among resonators working with surface waves and bulk waves, are suitable, in particular, as the resonators.

The filter 21 is arranged in the transmission path TX and the filter 22 is arranged in the reception path RX. The paths TX, RX are connected to a common connection (antenna connection) 20 that is connected to the module ground 69 by means of an electrical connection. This electrical connection comprises an inductor $L_{ANT}'$ arranged in the second substrate 11 and connected to the ground connection 58 of the second substrate 11 and an inductor $L_{ANT}$ connected in series with this inductor and arranged in the first substrate 3.

The parallel resonator 41 is connected to the module ground 69 by means of an electrical connection that comprises an inductor $L_{TX1}'$ arranged in the second substrate 11 and connected to the ground connection 51 of the second substrate 11 and an inductor $L_{TX1}$ connected in series with this inductor and arranged in the first substrate 3. The parallel resonator 42 is connected electrically to the module ground 69 by means of a series circuit of inductors $L_{TX2}'$, $L_{TX2}$, the parallel resonator 43 by means of a series circuit of inductors $L_{RX1}'$, $L_{RX1}$, and the parallel resonator 44 by means of a series circuit of inductors $L_{RX2}'$, $L_{RX2}$. The inductors $L_{TX2}'$, $L_{RX1}'$, and $L_{RX2}'$ are arranged in the second substrate 11 and connected to the ground connections 52, 53 and 54, respectively, of this substrate. The inductors $L_{TX2}$, $L_{RX1}$, and $L_{RX2}$ are arranged in the first substrate 3.

In the variant according to FIG. 3A, the shielding surface 13 is connected to a ground connection 59 of the second substrate 11 and by means of an inductor $L_P$ arranged in the first substrate 3 to the module ground 69, i.e., to the ground surface 64.

Figure 3B:
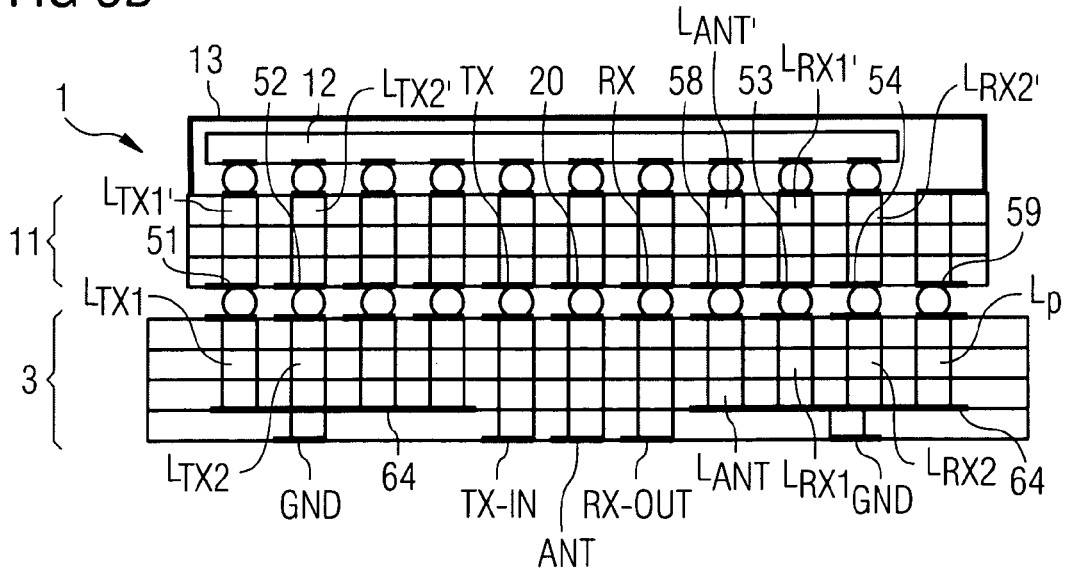
FIGS. 3B, 4B, 5B, show in cross section, the module with each duplexer according to FIG. 3A, 4A, or 5A.

The cross section of the module with the ground connection according to FIG. 3A is shown in section in FIG. 3B. The antenna connection 20 of the component 1 can be connected by means of an electrical connection arranged in the first substrate 3 to an antenna connection ANT of the module or to at least one of the other functional units of the module. The transmission path TX is connected by means of an electrical connection arranged at least partially in the first substrate 3 to an external connection TX-IN or to at least one of the other functional units of the module. The reception path RX is connected by means of an electrical connection arranged at least partially in the first substrate 3 to an external connection RX-OUT or to at least one of the other functional units of the module.

In the variant according to FIG. 4A, in contrast to FIG. 3A, in addition to the module ground 69 there is an intermediate ground that is realized as a conductive surface 63 arranged in the first substrate 3. The conductive surface 63 is advantageously arranged in a metallization plane that lies higher than the metallization plane in which the ground surface 64 is arranged. The shielding surface 13 is connected to the conductive surface 63 by means of an inductor $L_{p1}$ and the parallel resonator 44 by means of a series circuit of inductors $L_{RX2}'$, $L_{RX2}$. The conductive surface 63 is connected to the module ground 69 by means of an inductor $L_{p2}$.

Figure 4B:
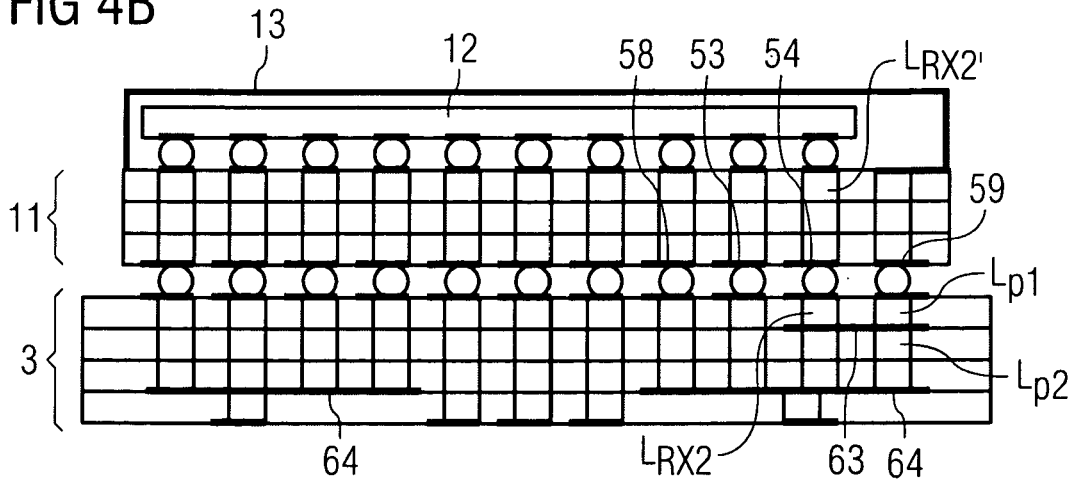

The cross section of the module with the ground connection according to FIG. 4A is shown in section in FIG. 4B.

In the variant according to FIG. 5A, the parallel resonator 44 is connected in a conductive way to the shielding surface 13 by means of an inductor $L_{RX2}'$. The shielding surface 13 is connected to the ground connection 59 of the second substrate 11 that is connected to the ground surface 64 and the module ground 69 by means of an inductor $L_p$.

At least one part of the inductor $L_{RX2}'$ can be arranged on the surface of the chip 12 and/or in an arbitrary metallization plane of the second substrate 11.

Figure 5B:
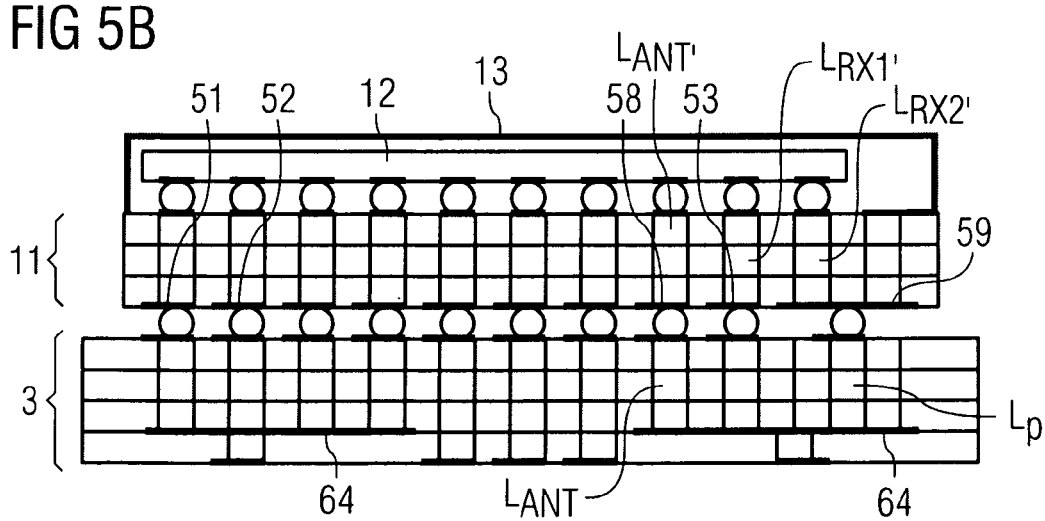

The cross section of the module with the ground connection according to FIG. 5A is shown in section in FIG. 5B.

The construction of the filters 21, 22 is not limited to the shown figures. The filters can have an arbitrary number of series arms and shunt arms with resonators arranged therein. There can be more shunt arms than series arms or vice versa.

Filters 21, 22 can be realized on one chip or on separate chips. These chips can be arranged in a common housing. However, it is also possible to cover each chip, e.g., with a separate metal cap. Instead of the flip-chip arrangement of the chip shown in FIG. 2, a construction is considered in which the chip is wire-bonded.

What is claimed is:

1. An electrical module comprising:
   a first substrate;
   a component mounted on the first substrate, the component comprising a second substrate and a chip arranged on the second substrate;
   a filter circuit arranged on the chip, the filter circuit comprising shunt arms coupled to ground, each shunt arm with at least one parallel resonator,
   wherein ground-side connections of at least two of the shunt arms to each other is realized outside the chip and the second substrate,
   wherein the component has a shielding surface, and
   wherein a ground connection of the shielding surface is not realized in the second substrate, but instead in the first substrate.

2. The module according to claim 1,
   wherein the shielding surface is electrically connected to one of the parallel resonators of the filter circuit by means of an electrical connection arranged in the first substrate, and
   wherein the electrical connection is electrically connected to a ground surface that is arranged in the first substrate and to which the at least two shunt arms of the filter circuit are connected.

3. The module according to claim 1,
   wherein one of the parallel resonators of the filter circuit is electrically connected to the shielding surface by means of an electrical connection arranged on the chip or in the second substrate, and
   wherein the shielding surface is electrically connected by means of another electrical connection to a ground surface that is arranged in the first substrate and to which the at least two shunt arms of the filter circuit are connected.

4. An electrical module comprising:
   a first substrate;
   a component mounted on the first substrate, the component comprising a second substrate and a chip arranged on the second substrate;
   a filter circuit arranged on the chip, the filter circuit comprising shunt arms coupled to ground, each shunt arm with at least one parallel resonator,
   wherein ground-side connections of at least two of the shunt arms to each other is realized outside the chip and the second substrate, and
   wherein the ground-side connection of at least two of the shunt arms is realized on a circuit board on which the first substrate is mounted.

5. The module according to claim 4, wherein a ground-side connection of another at least two of the shunt arms is realized in the first substrate.

6. The module according to claim 4, wherein the filter circuit comprises a duplexer that has a transmission filter and a reception filter, and
   wherein the at least two shunt arms connected to each other on a ground side outside the chip and the second substrate are part of the transmission filter or the reception filter.

7. The module according to claim 6,
wherein the duplexer comprises an antenna connection coupled to ground by means of a first electrical connection arranged partially in the second substrate, and
wherein a ground connection of the first electrical connection is not realized in the second substrate, but instead in the first substrate.

8. The module according to claim 7, wherein the first electrical connection comprises an inductor.

9. The module according to claim 4,
wherein the filter circuit comprises a duplexer that has a transmission filter and a reception filter, and
wherein of the at least two shunt arms connected to each other on the ground side outside the chip and the second substrate, at least one arm belongs to a transmission filter and at least one other arm belongs to a reception filter of the duplexer.

10. The module according to claim 9,
wherein the duplexer comprises an antenna connection coupled to ground by means of a first electrical connection arranged partially in the second substrate, and
wherein a ground connection of the first electrical connection is not realized in the second substrate, but instead in the first substrate.

11. The module according to claim 10, wherein the first electrical connection comprises an inductor.

12. The module according to claim 4,
wherein the component has a shielding surface, and
wherein a ground connection of the shielding surface is not realized in the second substrate, but instead in the first substrate.

13. The module according to claim 4, wherein there is no ground-side connection of shunt arms within the second substrate.

14. The module according to claim 4,
wherein at least one electrical connection arranged in the first and/or second substrate comprises at least one strip conductor that has at least one partial winding or is folded.

15. The module according to claim 4, wherein the other at least two shunt arms are electrically coupled to a ground surface arranged in the first substrate by means of electrical connections that are arranged partially in the second substrate.

16. The module according to claim 15, further comprising at least one other electrical component with ground connections coupled to the ground surface, the at least one other electrical component being arranged on the first substrate.

17. The module according to claim 16, wherein, in the first substrate, at least one circuit is integrated that is electrically connected to the component.

18. An electrical module comprising:
a first substrate;
a component mounted on the first substrate, the component comprising a second substrate and a chip arranged on the second substrate;
a filter circuit arranged on the chip, the filter circuit comprising shunt arms coupled to ground, each shunt arm with at least one parallel resonator;
wherein ground-side connections of at least two of the shunt arms to each other is realized outside the chip and the second substrate, and
wherein the at least two shunt arms are electrically coupled to a ground surface arranged in the first substrate by means of electrical connections that are arranged partially in the second substrate,
at least one other electrical component with ground connections coupled to the ground surface, the at least one other electrical component being arranged on the first substrate.

19. The module according to claim 18, wherein, in the first substrate, at least one circuit is integrated that is electrically connected to the component.

* * * * *

UNITED STATES PATENT AND TRADEMARK OFFICE
CERTIFICATE OF CORRECTION

| | | |
|---|---|---|
| PATENT NO. | : 7,944,325 B2 | Page 1 of 1 |
| APPLICATION NO. | : 12/352730 | |
| DATED | : May 17, 2011 | |
| INVENTOR(S) | : Korden | |

It is certified that error appears in the above-identified patent and that said Letters Patent is hereby corrected as shown below:

In Col. 9, line 15, claim 9, delete "a transmission" and insert --the transmission--.
In Col. 9, line 16, claim 9, delete "a reception" and insert --the reception--.
In Col. 10, line 1, claim 15, delete "the other" and insert --another--.

Signed and Sealed this
Twenty-sixth Day of July, 2011

David J. Kappos
*Director of the United States Patent and Trademark Office*